United States Patent
Shih et al.

(10) Patent No.: US 12,124,083 B2
(45) Date of Patent: Oct. 22, 2024

(54) SEMICONDUCTOR STRUCTURE WITH MULTI-LAYERS FILM

(71) Applicant: TAIWAN SEMICONDUCTOR MANUFACTURING COMPANY LTD., Hsinchu (TW)

(72) Inventors: Chih-Tsung Shih, Hsinchu (TW); Wei-Kang Liu, Taichung (TW); Sui-Ying Hsu, New Taipei (TW); Jing-Hwang Yang, Hsinchu County (TW); Yingkit Felix Tsui, Cupertino, CA (US)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 239 days.

(21) Appl. No.: 17/817,041

(22) Filed: Aug. 3, 2022

(65) Prior Publication Data
US 2024/0045141 A1 Feb. 8, 2024

(51) Int. Cl.
*G02B 6/124* (2006.01)
*G02B 6/12* (2006.01)

(52) U.S. Cl.
CPC .... *G02B 6/124* (2013.01); *G02B 2006/12107* (2013.01)

(58) Field of Classification Search
CPC ........ G02B 2006/12107; G02B 6/4212; G02B 6/4214; G02B 6/34; G02B 6/124; H01L 25/167
See application file for complete search history.

(56) References Cited

U.S. PATENT DOCUMENTS

| | | | |
|---|---|---|---|
| 7,053,988 B2 * | 5/2006 | Totzeck | G02B 5/1809 355/71 |
| 7,411,656 B2 * | 8/2008 | Totzeck | G03F 7/70566 355/71 |
| 8,452,141 B2 * | 5/2013 | Fu | G02B 6/34 385/37 |
| 9,285,554 B2 * | 3/2016 | Doany | G02B 6/32 |
| 9,671,563 B2 * | 6/2017 | Doany | G02B 6/3652 |
| 9,817,193 B2 * | 11/2017 | Doany | G02B 6/29323 |
| 9,935,089 B2 * | 4/2018 | Budd | H01L 25/167 |
| 10,025,031 B2 * | 7/2018 | Tokushima | G02B 6/136 |
| 10,295,741 B2 * | 5/2019 | Melikyan | G02B 6/30 |
| 10,509,169 B2 * | 12/2019 | Chang | G02B 6/124 |
| 10,921,525 B2 * | 2/2021 | Kojima | H01S 5/187 |
| 10,962,717 B2 * | 3/2021 | Kojima | G02B 6/34 |
| 11,079,540 B2 * | 8/2021 | Watanuki | G02F 1/2257 |
| 11,079,550 B2 * | 8/2021 | Kojima | G02B 6/124 |

(Continued)

*Primary Examiner* — Andrew Jordan
(74) *Attorney, Agent, or Firm* — WPAT Law; Anthony King

(57) ABSTRACT

A semiconductor structure includes a substrate, a grating coupler structure over the substrate, a multi-layers film structure over the grating coupler structure. The multi-layers film structure include a first layer including a first refractive index, a second layer over the first layer and including a second refractive index and a third layer over the second layer and including a third refractive index. The second refractive index is greater than the first refractive index and is greater than the third refractive index of the third layer, and a thickness of each layer of the multi-layers film structure is within a range from $\lambda/4$ to $\lambda 2$, $\lambda$ is a wavelength of light.

20 Claims, 7 Drawing Sheets

(56) References Cited

U.S. PATENT DOCUMENTS

| | | | | |
|---|---|---|---|---|
| 11,143,817 B2* | 10/2021 | Chang | G02B 6/1228 |
| 11,143,821 B1* | 10/2021 | Kojima | G02B 6/124 |
| 11,204,467 B2* | 12/2021 | Kojima | G02B 6/124 |
| 11,609,478 B2* | 3/2023 | Kim | G02B 6/12004 |
| 11,650,371 B2* | 5/2023 | Kojima | G02B 6/34 |
| | | | 385/37 |
| 11,662,525 B1* | 5/2023 | Hsieh | G02B 6/124 |
| | | | 385/37 |
| 11,662,526 B1* | 5/2023 | Hsieh | G02B 6/124 |
| | | | 385/33 |
| 11,662,584 B2* | 5/2023 | Lee | G02B 27/0172 |
| | | | 359/630 |
| 11,683,098 B2* | 6/2023 | Di Teodoro | G02B 5/1814 |
| | | | 398/188 |
| 11,747,563 B2* | 9/2023 | Hsia | G02B 6/124 |
| | | | 385/14 |
| 11,796,735 B2* | 10/2023 | Yu | G02B 6/4214 |
| 11,892,678 B2* | 2/2024 | Wu | G02B 6/13 |
| 2006/0152701 A1* | 7/2006 | Totzeck | G02B 27/286 |
| | | | 355/71 |
| 2006/0233505 A1* | 10/2006 | Zheng | G02B 6/42 |
| | | | 385/129 |
| 2012/0027350 A1* | 2/2012 | Fu | G02B 6/34 |
| | | | 385/37 |
| 2013/0209026 A1* | 8/2013 | Doany | G02B 6/32 |
| | | | 438/32 |
| 2015/0286008 A1* | 10/2015 | Shimizu | G02B 6/124 |
| | | | 385/37 |
| 2016/0195678 A1* | 7/2016 | Doany | G02B 6/34 |
| | | | 438/31 |
| 2017/0186670 A1* | 6/2017 | Budd | H01L 25/167 |
| 2017/0261704 A1* | 9/2017 | Doany | G02B 6/136 |
| 2018/0114785 A1* | 4/2018 | Budd | H01S 5/18361 |
| 2018/0128975 A1* | 5/2018 | Tokushima | G02B 6/124 |
| 2018/0284343 A1* | 10/2018 | Melikyan | G02B 6/125 |
| 2019/0121025 A1* | 4/2019 | Verslegers | G02B 5/1861 |
| 2019/0129098 A1* | 5/2019 | Chang | G02B 6/124 |
| 2019/0196099 A1* | 6/2019 | Watanuki | G02F 1/2257 |
| 2020/0081185 A1* | 3/2020 | Chang | G02B 6/1228 |
| 2020/0174194 A1* | 6/2020 | Kojima | G02B 6/124 |
| 2020/0241204 A1* | 7/2020 | Kojima | G02B 6/29323 |
| 2020/0241205 A1* | 7/2020 | Kojima | H01S 5/142 |
| 2020/0379314 A1* | 12/2020 | Hashiya | G02F 1/015 |
| 2021/0116645 A1* | 4/2021 | Kojima | G02B 6/124 |
| 2021/0181427 A1* | 6/2021 | Kojima | G02B 6/34 |
| 2021/0199971 A1* | 7/2021 | Lee | G02B 27/0172 |
| 2021/0389642 A1* | 12/2021 | Kim | G02B 6/4214 |
| 2022/0021460 A1* | 1/2022 | Di Teodoro | G02B 5/1814 |
| 2022/0146742 A1* | 5/2022 | Mitobe | F21V 9/14 |
| 2022/0196936 A1* | 6/2022 | Hosseini | G02B 6/124 |
| 2022/0381985 A1* | 12/2022 | Hsia | G02B 6/12002 |
| 2023/0012157 A1* | 1/2023 | Yu | G02B 6/12004 |
| 2023/0068603 A1* | 3/2023 | Wu | G02B 6/12 |
| 2023/0185027 A1* | 6/2023 | Hsieh | G02B 6/0016 |
| | | | 385/37 |
| 2023/0185028 A1* | 6/2023 | Hsieh | G02B 6/003 |
| 2023/0358950 A1* | 11/2023 | Yu | G02B 6/136 |
| 2023/0384527 A1* | 11/2023 | Wu | G02B 6/30 |
| 2024/0045141 A1* | 2/2024 | Shih | G02B 6/4212 |
| 2024/0113091 A1* | 4/2024 | Lo | H01L 23/5226 |

\* cited by examiner

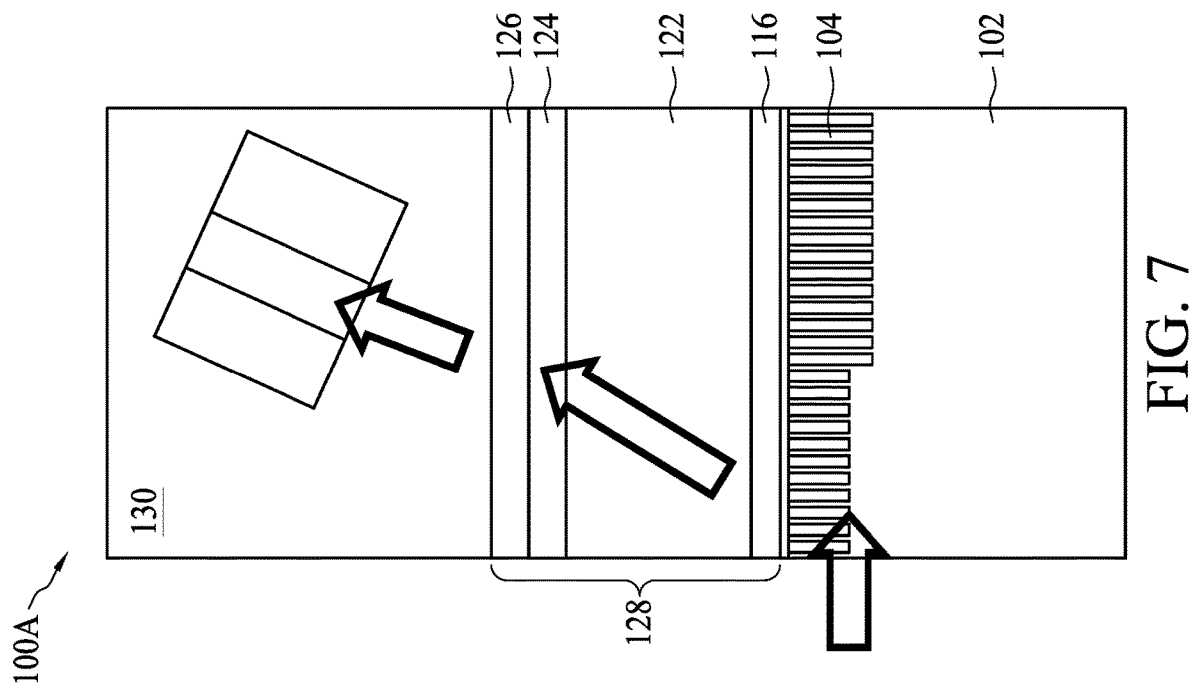

SEMICONDUCTOR STRUCTURE WITH MULTI-LAYERS FILM

BACKGROUND

The semiconductor integrated circuit (IC) industry has experienced exponential growth. Technological advances in IC design and material have produced generations of ICs where each generation has smaller and more complex circuits than previous generation. In the course of IC evolution, functional density (i.e., the number of interconnected devices per chip area) has generally increased while geometry size (i.e., the smallest component (or line) that can be created using a fabrication process) has decreased.

Optical signaling and processing have been used in increasingly more applications in recent years, particularly due to the use of optical fiber-related applications for signal transmission.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 7 illustrates a schematic cross-section view of a waveguide region according to some embodiments of the present disclosure.

DETAILED DESCRIPTION

Figure 1:
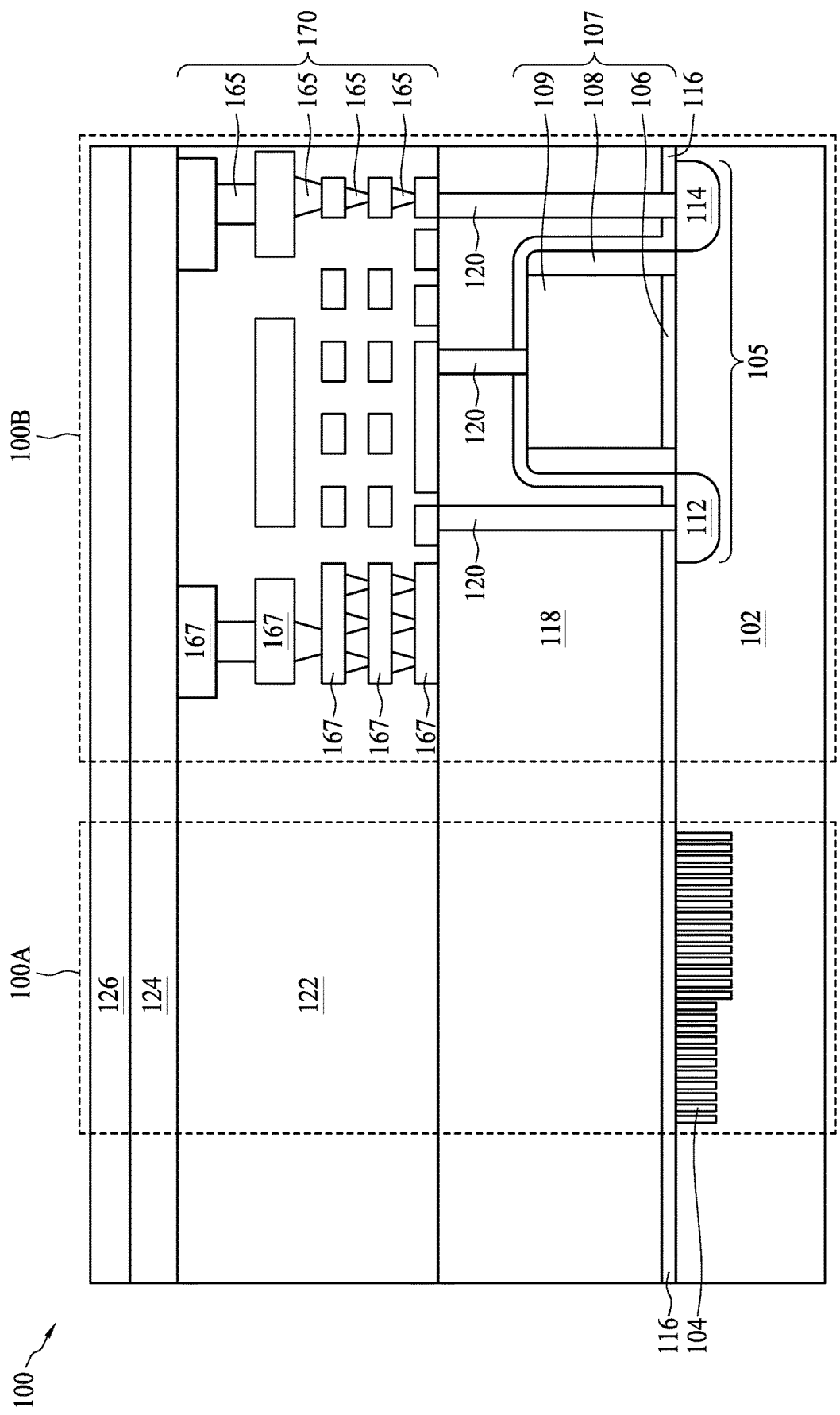
FIG. 1 illustrates a schematic cross-section view of a semiconductor structure according to some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, are used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus is otherwise oriented (rotated 90 degrees or at other orientations) and the spatially relative descriptors used herein are likewise interpreted accordingly. In the present disclosure, a phrase "one of A, B and C" means "A, B and/or C" (A, B, C, A and B, A and C, B and C, or A, B and C), and does not mean one element from A, one element from B and one element from C, unless otherwise described.

As used herein, although terms such as "first," "second" and "third" describe various elements, components, regions, layers and/or sections, these elements, components, regions, layers and/or sections are not limited by these terms. These terms are used to distinguish one element, component, region, layer, or section from another. Terms such as "first," "second" and "third" in response to used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that is contemplated by people having ordinary skill in the art. Alternatively, the terms "substantially," "approximately" and "about" mean within an acceptable standard error of the mean in response to considered by one of ordinary skill in the art. People having ordinary skill in the art understand that the acceptable standard error varies according to different technologies. Other than in the operating/working examples, or unless otherwise expressly specified, the numerical ranges, amounts, values, and percentages such as those for quantities of materials, durations of times, temperatures, operating conditions, ratios of amounts, and the likes thereof disclosed herein should be understood as modified in instances by the terms "substantially," "approximately" or "about." Accordingly, unless indicated to the contrary, the numerical parameters set forth in the present disclosure and attached claims are approximations that vary as desired. At the very least, each numerical parameter is construed considering the number of reported significant digits and by applying ordinary rounding techniques. Ranges are expressed herein as from one endpoint to another endpoint or between two endpoints. All ranges disclosed herein are inclusive of the endpoints, unless otherwise specified.

Grating coupler structures of a waveguide are often used in an integrated optical chip of a semiconductor structure. In some comparative approaches, the semiconductor structure includes a semiconductor substrate, a grating coupler structure formed in the semiconductor substrate and a plurality of layers of ILD (inter level dielectric, also known as pre-metal dielectric) material formed over the semiconductor substrate at the waveguide region. The grating coupler structures of the waveguide delivers light to an optical fiber, the coupling efficiency, defined as the ratio of the amount of light coupled into the optical fiber to the quantity of the light delivered by grating coupler structures of the waveguide. The coupling efficiency affects the performance of the waveguide structure and, consequently, the integrated optical chips.

A flow to optimize the coupling efficiency, the grating coupler structures for SPGC (Single-Polarization Grating Coupler, SPGC) optimization may randomly tuning period by calculating phase matching condition of 1D-GC (i.e. a 1D-GC(Grating Coupler) and light is coupled in the direction of index variation). This can obtain initial period of SPGC. Then check the loss with 3D FDTD (Finite Differential Time Domain) simulation the same as 2D results. By the way of randomly tuning grating period and the duty cycle of grating ridges etched depths may obtain the maximum coupling efficiency. However, these approaches are limited by film scheme over the grating coupler. Thus, there is a need to enhance the coupling efficiency of the grating coupler for the integrated optical chips, e.g. to add optimization flow for film scheme consideration.

Embodiments of film schemes of the grating coupler structure including several film schemes is therefore provided. The film schemes of the grating coupler structure are illustrated herein. Variations of the embodiments are also discussed. Throughout the various views and illustrative embodiments, like reference numbers are used to designate like elements.

FIG. 1 illustrates a schematic cross-section view of a semiconductor structure 100 according to some embodiments of the present disclosure. In some embodiments, the semiconductor structure 100 may include a waveguide region 100A and a logic region 100B. In some embodiments, the waveguide region 100A includes a grating coupler structure 104 formed in a semiconductor substrate 102. In some embodiments, the logic region 100B includes a circuit component 105 formed on the semiconductor substrate 102. A plurality of layers of ILD material 122 may be formed over the semiconductor substrate 102 at both the waveguide region 100A and the logic region 100B.

In some embodiments, the semiconductor substrate 102 may be a bulk silicon substrate. Alternatively, the semiconductor substrate 102 may be comprised of an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. In some embodiments, the semiconductor substrate 102 may also include a silicon-on-insulator (SOI) substrate. SOI substrates are fabricated using separation by implantation of oxygen (SIMOX), wafer bonding, and/or other suitable methods. In some exemplary embodiments, semiconductor substrate 102 includes an insulator layer. The insulator layer may be comprised of any suitable material, including silicon oxide, sapphire, other suitable insulating materials, and/or combinations thereof. An exemplary insulator layer may be a buried oxide layer (BOX). The insulator may be formed by any suitable process, such as implantation (e.g., SIMOX), oxidation, deposition, and/or other suitable process.

The semiconductor substrate 102 may include various doped regions depending on design requirements as known in the art (e.g., p-type wells or n-type wells). The doped regions are doped with p-type dopants, such as boron or $BF_2$; n-type dopants, such as phosphorus or arsenic; or combinations thereof. The doped regions may be formed directly on the semiconductor substrate 102, in a P-well structure, in an N-well structure, in a dual-well structure, or using a raised structure. The semiconductor substrate 102 may further include various active regions, such as regions configured for an N-type metal-oxide-semiconductor transistor device and regions configured for a P-type metal-oxide-semiconductor transistor device.

In some embodiments, the ILD material 122 includes multilayers made of multiple dielectric materials, such as silicon oxide, silicon nitride, silicon oxynitride, tetraethoxysilane (TEOS), phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. In some embodiments, the ILD material 122 may be formed by chemical vapor deposition (CVD), physical vapor deposition (PVD), atomic layer deposition (ALD), spin-on coating, or other applicable processes.

The grating coupler structure 104 allows the waveguide region 100A to transmit light to or receive light from the overlying light source or optical signal source. The grating coupler structure 104 may be formed by photolithography and etching techniques. In some embodiments, the grating coupler structure 104 transforms the light signal into modulated light signal and delivers light to the optical fiber. In some embodiments, the grating coupler structure 104 includes one of a metal, such as copper or aluminum, or a high-k dielectric material. In some embodiments, the grating coupler structure 104 have a thickness ranging from about 20 nm to 200 nm for coupling a light signal passing through the plurality of layers of ILD material 122, but the disclosure is not limited thereto. In some embodiments, the grating pitch of the grating coupler structure 104 is greater than the critical dimension (CD) of the process, but the disclosure is not limited thereto. In some embodiments, the grating coupler structure 104 has different grating periods defined by different grating pitch.

In some embodiments, the circuit component 105 of the logic region 100B is depicted as a transistor having a gate element 107 and source/drain regions 112 and 114 formed in the semiconductor substrate 102. Source/drain region(s) may refer to a source or a drain, individually or collectively dependent upon the context. In some embodiments, the source/drain regions 112 and 114 may be formed by doping select regions in the logic region 100B of the semiconductor substrate 102. The gate element 107 includes a dielectric layer 106 on a surface of semiconductor substrate 102. The dielectric layer 106 may be oxide. In another embodiment, the dielectric layer 106 may be silicon nitride as a barrier to impurity diffusion. In other embodiments, the dielectric layer 106 may also be an oxy-nitride, an oxygen-containing dielectric, a nitrogen-containing dielectric or any combination thereof. The gate element 107 further includes a gate electrode 109 formed on the dielectric layer 106. The gate electrode 109 is polysilicon. The polysilicon has the ability of being used as a mask to achieve minimum gate-to-source/drain overlap. This in turn enhances the device performance. The polysilicon is then doped to reduce the sheet resistance. The gate element 107 further includes a pair of spacers 108 formed along sidewalls of the dielectric layer 106 and the gate electrode 109. The spacer material can be oxide, silicon nitride, oxy-nitride or any combination thereof.

In some embodiments, a contact etch stop layer (CESL) 116 is blanket deposited over the semiconductor substrate 102 by Plasma-Enhanced Chemical Vapor Deposition (PECVD), or other methods such as ALD or Low Pressure Chemical Vapor Deposition (LPCVD). In one embodiment, the material of the contact etch stop layer 116 is silicon nitride. In another embodiment of forming the contact etch stop layer 116, the material of contact etch stop layer 116 is nitrogen-doped oxide such as NDC and SiCN, or carbon-doped oxide such as CDO, SiOC, and ODC. The contact etch stop layer 116 prevents contact plugs 120 through when perform a etch process. The addition of the contact etch stop layer 116 causes inherent stress in the device. It is known that the stress in the device can enhance the carrier mobility, therefore enhancing the device performance.

A dielectric or insulation layer 118 further covers the circuit component 105 and the outer portion of the gate element 107. The contact plugs 120 in the dielectric or insulation layer 118 provides contacts between gate/drain/source terminals of the circuit component 105 and an interconnection structure 170 formed over the dielectric or insulation layer 118. Gate/source/drain terminal(s) may refer to a gate or a source or a drain, individually or collectively dependent upon the context. The contact plugs 120 may be formed of standard materials such as copper or tungsten.

In some embodiments, the dielectric or insulation layer 118 is deposited on the surface of the contact etch stop layer 116. The dielectric or insulation layer 118 provides insulation between the transistor and the overlying metal lines that are formed subsequently. In some embodiments, the dielectric or insulation layer 118 may be deposited using, e.g., Tetraethyl Orthosilicate (TEOS), CVD, PECVD, LPCVD, or other deposition techniques. After depositing the dielectric or insulation layer 118, the contact plugs 120 are formed to passing through the dielectric or insulation layer 118 and the contact etch stop layer 116 over the gate electrode 109 and the source/drain regions 112 and 114. The contact plugs 120 may be formed of tungsten, aluminum, copper, or other alternatives. The contact plugs 120 may also be composite structures, including, e.g., barrier and adhesion layers, such as titanium/titanium nitride or tantalum nitride, and other layers as well.

As shown in FIG. 1, the interconnection structure 170 includes a plurality of metallization layers 167 and a plurality of inter-level contact plugs 165 formed in the plurality of layers of ILD material 122 over the logic region 100B. In some embodiments, the plurality of inter-level contacts plugs 165 and the plurality of metallization layers 167 are embedded in the plurality of layers of ILD material 122 over the dielectric or insulation layer 118. In some embodiments, the metallization layers 167 and the inter-level contact plugs 165 are comprised of metallic material such as copper, aluminum, or alloys thereof, using known techniques such as damascene, dual damascene, or subtractive metal etching. Although the exemplary embodiments described herein depict five metal layers, this is merely illustrative and it should be understood that the semiconductor structure 100 may alternatively be formed with more or fewer metal layers, depending on the application. The plurality of inter-level contacts plugs 165 provides interconnections between the metallization layers 167.

In some embodiments, a capping layer 124 is formed over the ILD material 122. In some embodiments, the capping layer 124 may be silicon carbide (SiC). In other embodiments, the capping layer 124 may be a shield layer made of one of Si, silicon nitride, titanium silicide, SiC, SiCl, Ti, TiC, TiCl, TiN and SiTiN, but the disclosure is not limited thereto. In some embodiments, the shield layer is formed by CVD, ALD or any other suitable film formation methods.

In some embodiments, a passivation layer 126 is formed over the capping layer 124 using a suitable process such as a process including a deposition process and a chemical mechanical polishing (CMP) process. In some embodiments, the passivation layer 126 may be silicon dioxide ($SiO_2$). In other embodiment, the passivation layer 126 includes a dielectric material, such as silicon oxide ($SiO_2$), silicon nitride ($Si_3N_4$), silicon oxynitride (SiON), or a combination thereof, and may include one layer of a dielectric material or multiple layers of dielectric materials, but the disclosure is not limited thereto.

Figure 2:
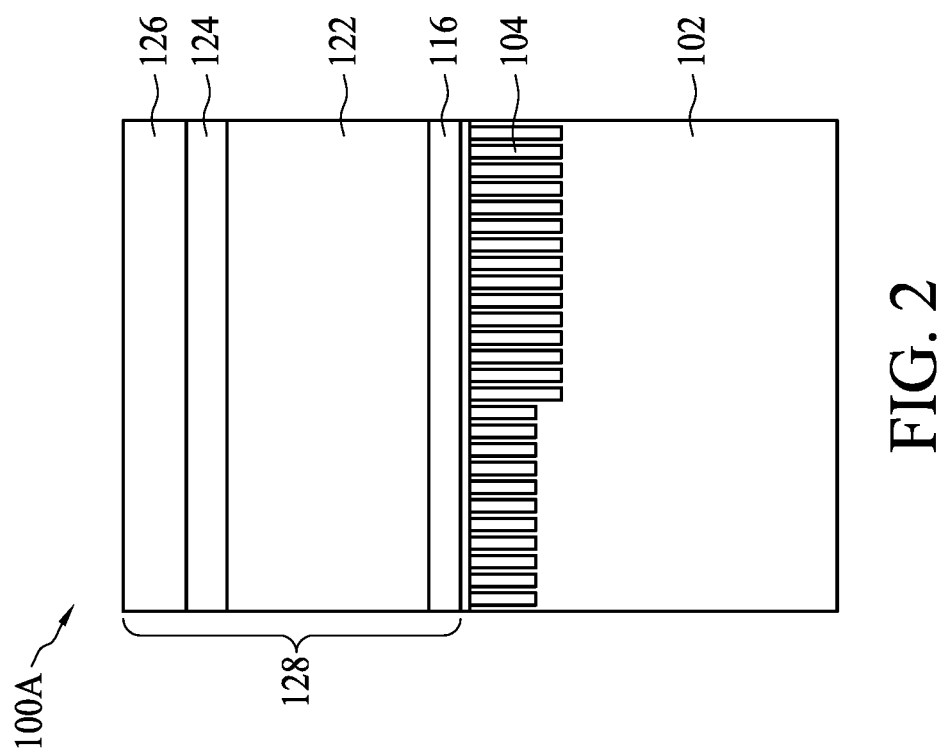
FIG. 2 illustrates a schematic cross-section view of a waveguide region according to some embodiments of the present disclosure.

FIG. 2 illustrates a schematic cross-section view of the waveguide region 100A in FIG. 1, according to some embodiments of the present disclosure. Referring to FIG. 2, in some embodiments, a multi-layers film structure 128 is over the grating coupler structure 104 of the waveguide region 100A. The multi-layers film structure 128 entirely covers the grating coupler structure 104. In some embodiments, the multi-layers film structure 128 includes the contact etch stop layer 116 with a first refractive index, the ILD material 122 with a second refractive index, the capping layer 124 with a third refractive index and the passivation layer 126 with a fourth refractive index. In some embodiments, the first refractive index of the contact etch stop layer 116 is greater than the second refractive index of the ILD material 122, and the third refractive index of the capping layer 124 is greater than the second refractive index of the ILD material 122 and the fourth refractive index of the passivation layer 126. In some embodiments, a thickness of each layer of the multi-layers film structure 128 is within a range from $\lambda/4$ to $\lambda/2$, where $\lambda$ is a wavelength of light. There is a relationship between the thickness of each layer of the multi-layers film structure 128 and a refractive index of each layer of the multi-layers film structure 128. For instance, the parameters of the multi-layers film structure 128 may be used to satisfy an equation, such as a destructive interference equation, related to the wavelength of light, such as Equation 1, where d is the thickness of each layer of the multi-layers film structure 128, n is the refractive index of each layer of the multi-layers film structure 128, m is a diffraction order, m is a value as 0, ±1, ±2 etc., normally m being a positive integer such as 1:

$$\frac{n \times 2\pi}{\lambda \times d} = m \times \pi \qquad \text{(Eq. 1)}$$

In some embodiments, the contact etch stop layer 116 is deposited to a thickness within a range from about 10 nanometer to about 100 nanometer, for example, about 78 nanometer, but the disclosure is not limited thereto. In some embodiments, a thickness of the ILD material 122 may be within a range from about 400 nanometer to about 2000 nanometer, for example, about 1300 nanometer, but the disclosure is not limited thereto. In some embodiments, a thickness of the capping layer 124 may be within a range from about 10 nanometer to about 100 nanometer, for example, about 40 nanometer, but the disclosure is not limited thereto. In some embodiments, a thickness of the passivation layer 126 may be within a range from about 10 nanometer to about 100 nanometer, for example, about 50 nanometer, but the disclosure is not limited thereto.

In some embodiments, the refractive indices of the multi-layers film structure 128 is associated with the thicknesses of the multi-layers film structure 128. In some embodiments, the multi-layers film structure 128 may include a layer of high refractive index, a layer of low refractive index, a layer of high refractive index and a layer of low refractive index. In such embodiments, the multi-layer film structure 128 may be referred to as an H/L/H/L structure. Further, a thickness of the layer of high refractive layer is less than a thickness of the layer of low refractive layer. For one example, in some embodiments, where the first refractive index of the contact etch stop layer 116 is greater than the second refractive index of the ILD material 122, is respective to the thickness of the contact etch stop layer 116 is less than the thickness of the ILD material 122. For another example, in some embodiments, where the third refractive index of the capping layer 124 is greater than the second refractive index of the ILD material 122 and the fourth refractive index of the passivation layer 126, is respective to the thickness of the capping layer 124 is less than the thickness of the ILD material 122 and the thickness of the passivation layer 126.

As described above, the grating coupler structure 104 allows the light transmit through the multi-layers film structure 128 to the optical fiber. The multi-layers film structure 128 includes multiple layers disposed over the grating coupler structure 104. Each layer has different refractive index. The greater refractive index has the smaller thickness relatively. The variation of the refractive indices by tuning the layers arrangement and the thickness of each layer in the multi-layers film structure 128 may optimized the coupling efficiency.

Figure 3:
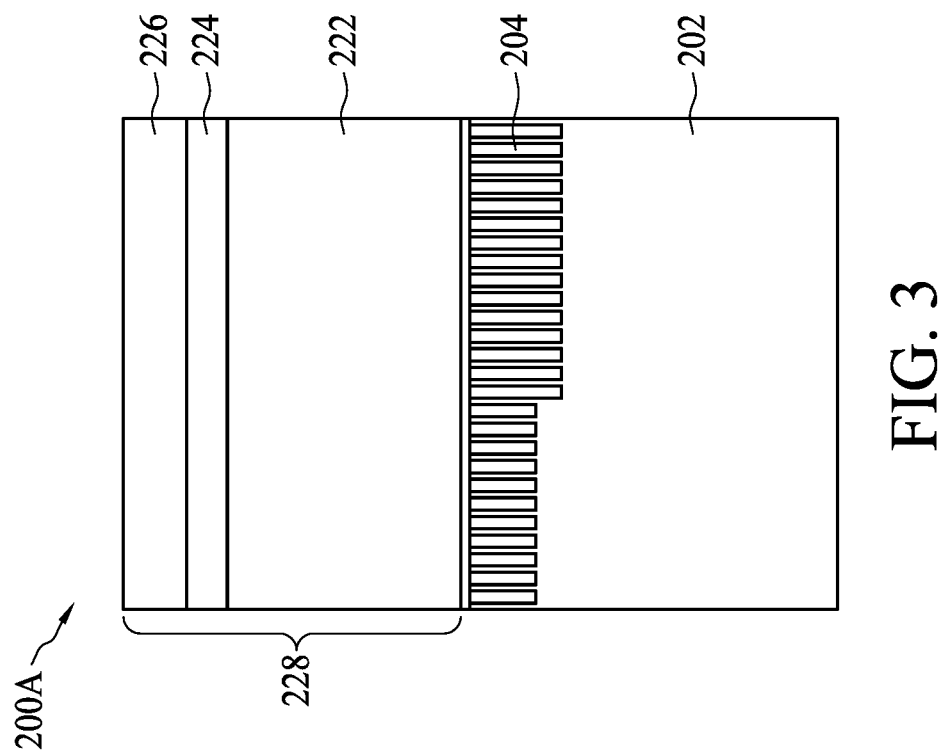
FIG. 3 illustrates a schematic cross-section view of a waveguide region according to some embodiments of the present disclosure.

FIG. 3 illustrates a schematic view of a waveguide region 200A according to some embodiments of the present disclosure. In some embodiments, the waveguide region 200A includes a grating coupler structure 204 over a substrate 202 and a multi-layers film structure 228 over the grating coupler structure 204. The multi-layers film structure 228 entirely covers the grating coupler structure 204. In some embodiments, the multi-layers film structure 228 includes an ILD material 222, a capping layer 224 over the ILD material 222 and a passivation layer 226 over the capping layer 224. In some embodiments, materials of the grating coupler structure 204, the ILD material 222, the capping layer 224 and the passivation layer 226 are similar to the materials of the grating coupler structure 104, the ILD material 122, the capping layer 124 and the passivation layer 126, as described above, but the disclosure is not limited thereto.

In some embodiments, the ILD material 222 includes a first refractive index, the capping layer 224 includes a second refractive index and the passivation layer 226 includes a third refractive index In some embodiments, the second refractive index of the capping layer 224 is greater than the first refractive index of the ILD material 222 and the third refractive index of the passivation layer 226. In some embodiments, a thickness of each layer of the multi-layers film structure 228 is within a range from $\lambda/4$ to $\lambda/2$, where $\lambda$ is a wavelength of light. There is a relationship between the thickness of each layer of the multi-layers film structure 228 and a refractive index of each layer of the multi-layers film structure 228. In some embodiments, the relationship between the thickness of each layer of the multi-layers film structure 228 and a refractive index of each layer of the multi-layers film structure 228 is $n2\pi/\lambda*d=m\pi$, where n is the refractive index, d is the thickness and m is a diffraction order, m being a positive integer. For instance, the parameters of the multi-layers film structure 228 may be used to satisfy the equation 1 (Eq. 1), as described above.

In some embodiments, a thickness of the ILD material 222 may be within a range from about 780 nanometer to about 1310 nanometer, for example, about 780 nanometer, but the disclosure is not limited thereto. In some embodiments, a thickness of the capping layer 124 may be within a range from about 10 nanometer to about 100 nanometer, for example, about 40 nanometer, but the disclosure is not limited thereto. In some embodiments, a thickness of the passivation layer 126 may be within a range from about 10 nanometer to about 100 nanometer, for example, about 50 nanometer, but the disclosure is not limited thereto.

In some embodiments, the refractive indices of the multi-layers film structure 228 is associated with the thicknesses of the multi-layers film structure 228. In some embodiments, the multi-layers film structure 228 may include a layer of low refractive index, a layer of high refractive index and a layer of low refractive index. In such embodiments, the multi-layer film structure 228 may be referred to as an L/H/L structure. Further, the thickness of the layer of high refractive index is less than the thickness of the layer of low refractive index. For example, in some embodiments, where the second refractive index of the capping layer 224 is greater than the first refractive index of the ILD material 222 and the third refractive index of the passivation layer 226, is respective to the thickness of the capping layer 224 is less than the thickness of the ILD material 222 and the thickness of the passivation layer 226.

As described above, the grating coupler structure 204 allows the light transmit through the multi-layers film structure 228 to the optical fiber. The multi-layers film structure 228 includes multiple layers disposed over the grating coupler structure 204. Each layer has different refractive index. The greater refractive index has the smaller thickness relatively. The variation of the refractive indices by tuning the layers arrangement and the thickness of each layer in the multi-layers film structure 228 may optimized the coupling efficiency.

Figure 4:
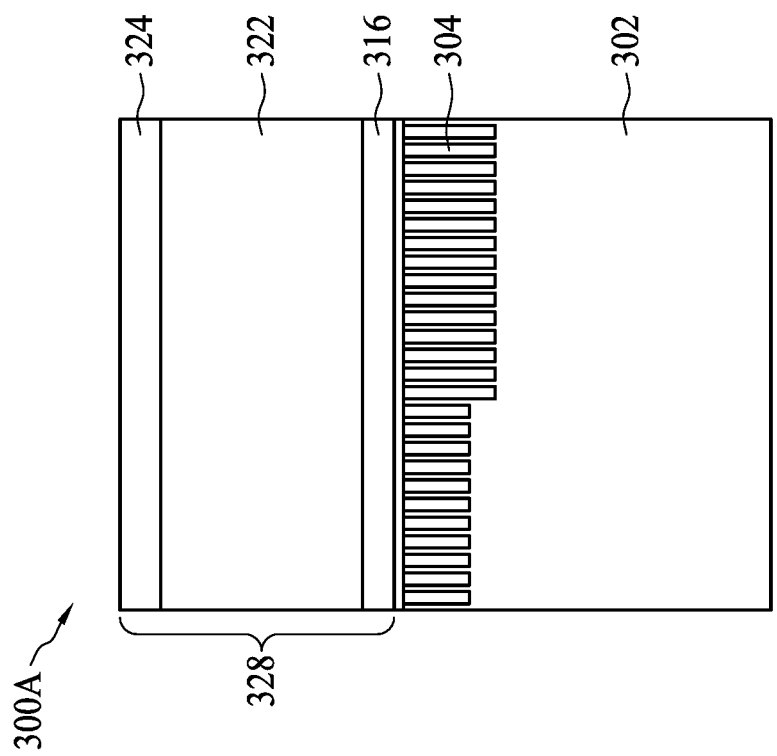
FIG. 4 illustrates a schematic cross-section view of a waveguide region according to some embodiments of the present disclosure.

FIG. 4 illustrates a schematic view of a waveguide region 300A according to some embodiments of the present disclosure. In some embodiments, the waveguide region 300A includes a grating coupler structure 304 over a substrate 302 and a multi-layers film structure 328 over the grating coupler structure 304. The multi-layers film structure 328 entirely covers the grating coupler structure 304. In some embodiments, the multi-layers film structure 328 includes a contact etch stop layer 316 over the grating coupler structure 304, an ILD material 322 over the contact etch stop layer 316 and a capping layer 324 over the ILD material. In some embodiments, materials of the grating coupler structure 304, the contact etch stop layer 316, the ILD material 322 and the capping layer 324 are similar to the materials of the grating coupler structure 104, the contact etch stop layer 116, the ILD material 122 and the capping layer 124, as described above, but the disclosure is not limited thereto. In some embodiments, the contact etch stop layer 316 includes a first refractive index, the ILD material 322 includes a second refractive index and the capping layer 324 includes a third refractive index. In some embodiments, the first refractive index of the contact etch stop layer 316 is greater than the second refractive index of the ILD material 322, and the third refractive index of the capping layer 324 is greater than the second refractive index of the ILD material 322. In some embodiments, a thickness of each layer of the multi-layers film structure 328 is within a range from $\lambda/4$ to $\lambda/12$, where $\lambda$ is a wavelength of light. There is a relationship between the thickness of each layer of the multi-layers film structure 328 and a refractive index of each layer of the multi-layers film structure 328. In some embodiments, the relationship between the thickness of each layer of the multi-layers film structure 328 and a refractive index of each layer of the multi-layers film structure 328 is $n2\pi/\lambda*d=m\pi$, where n is the refractive index, d is the thickness and m is a diffraction order, m being a positive integer. For instance, the parameters of the multi-layers film structure 328 may be used to satisfy the equation 1 (Eq. 1), as described above.

In some embodiments, a thickness of the contact etch stop layer 316 may be within a range from about 10 nanometer to about 100 nanometer, for example, about 78 nanometer, but the disclosure is not limited thereto. In some embodiments, a thickness of the ILD material 322 may be within a range from about 780 nanometer to about 1310 nanometer, for example, about 780 nanometer, but the disclosure is not limited thereto. In some embodiments, a thickness of the capping layer 324 may be within a range from about 10 nanometer to about 100 nanometer, for example, about 40 nanometer, but the disclosure is not limited thereto.

In some embodiments, the refractive indices of the multi-layers film structure 328 is associated with the thicknesses of the multi-layers film structure 328. In some embodiments, the multi-layers film structure 328 may include a layer of high refractive index, a layer of low refractive index and a layer of high refractive index. In such embodiments, the multi-layer film structure 328 may be referred to as an H/L/H structure. Further, the thickness of the layer of high refractive index is less than the thickness of the layer of low refractive index. For one example, in some embodiments, where the third refractive index of the capping layer 324 is greater than the second refractive index of the ILD material 322, is respective to the thickness of the capping layer 324 is less than the thickness of the ILD material 322. For another example, in some embodiments, where the first refractive index of the contact etch stop layer 316 is greater than the second refractive index of the ILD material 322, is respective to the thickness of the contact etch stop layer 316 is less than the thickness of the ILD material 322.

As described above, the grating coupler structure 304 allows the light transmit through the multi-layers film structure 328 to the optical fiber. The multi-layers film structure 328 includes multiple layers disposed over the grating coupler structure 304. Each layer has different refractive index. The greater refractive index has the smaller thickness relatively. The variation of the refractive indices by tuning the layers arrangement and the thickness of each layer in the multi-layers film structure 328 may optimized the coupling efficiency.

Figure 5:
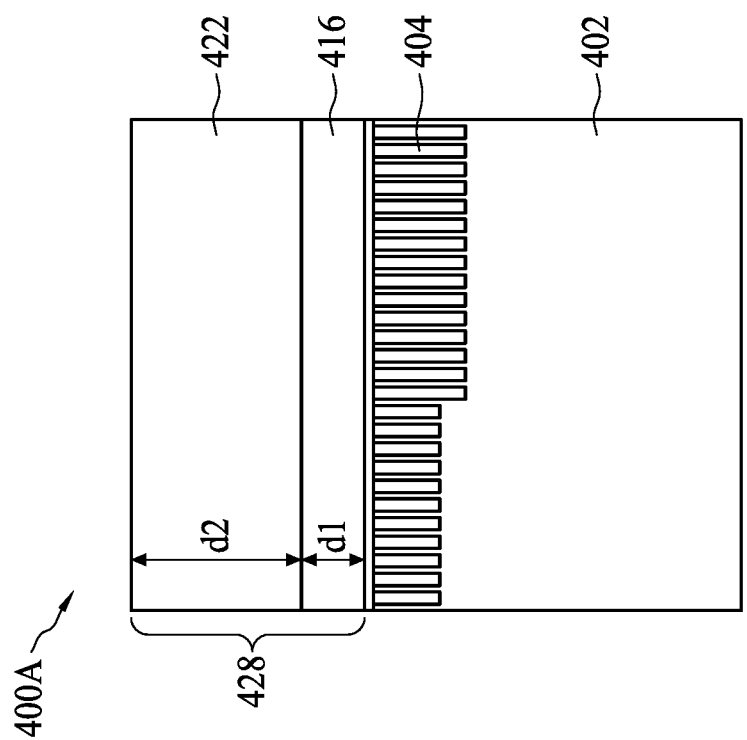
FIG. 5 illustrates a schematic cross-section view of a waveguide region according to some embodiments of the present disclosure.

FIG. 5 illustrates a schematic view of a waveguide region 400A according to some embodiments of the present disclosure. In some embodiments, the waveguide region 400A includes a grating coupler structure 404 over a substrate 402 and a first pair of layers 428 over the grating coupler structure 404. The first pair of layers 428 entirely covers the grating coupler structure 404. In some embodiments, the first pair of layers 428 includes a contact etch stop layer 416 over the grating coupler structure 404 and an ILD material 422 over the contact etch stop layer 416. In some embodiments, materials of the grating coupler structure 404, the contact etch stop layer 416 and the ILD material 422 are similar to the materials of the grating coupler structure 104, the contact etch stop layer 116 and the ILD material 122, as described above, but the disclosure is not limited thereto. In some embodiments, the contact etch stop layer 416 includes a first refractive index n1 and a first thickness d1, and the ILD material 422 includes a second refractive index n2 and a second thickness d2. In some embodiments, the first refractive index n1 of the contact etch stop layer 416 is greater than the second refractive index n2 of the ILD material 422. In some embodiments, a thickness of each layer of the first pair of layers 428 is within a range from $\lambda/4$ to $\lambda/2$, where $\lambda$ is a wavelength of light. There is a relationship between the thickness of each layer of the first pair of layers 428 and a refractive index of each layer of the first pair of layers 428. In some embodiments, the relationship between the thickness of each layer of the first pair of layers 428 and a refractive index of each layer of the first pair of layers 428 is $n2\pi/\lambda*d=m\pi$, where n is the refractive index, d is the thickness and m is a diffraction order, m being a positive integer. For one example, in some embodiments, the relationship between the first thickness d1 and the first refractive index n1 is $n1*2\pi/\lambda*d1=m\pi$, where m is a diffraction order, m being a positive integer. For another example, in some embodiments, the relationship between the second thickness d2 and the second refractive index n2 is $n2*2\pi/\lambda*d2=m\pi$. The parameters of the first pair of layers 428 may be used to satisfy the equation 1 (Eq. 1), as described above.

In some embodiments, the thickness d1 of the contact etch stop layer 416 may be within a range from about 10 nanometer to about 100 nanometer, but the disclosure is not limited thereto. In some embodiments, the thickness d2 of the ILD material 422 may be within a range from about 400 nanometer to about 2000 nanometer, but the disclosure is not limited thereto.

In some embodiments, the refractive indices of the first pair of layers 428 is associated with the thicknesses of the first pair of layers 428. In some embodiments, the first pair of layers 428 may include a layer of high refractive index and a layer of low refractive index. In such embodiments, the first pair of layers 428 may be referred to as an H/L structure. Further, the thickness of the layer of high refractive index is less than the thickness of the layer of low refractive index. For example, in some embodiments, where the first refractive index n1 of the contact etch stop layer 416 is greater than the second refractive index n2 of the ILD material 422, is respective to the first thickness d1 of the contact etch stop layer 416 is less than the second thickness d2 of the ILD material 422.

Figure 6:
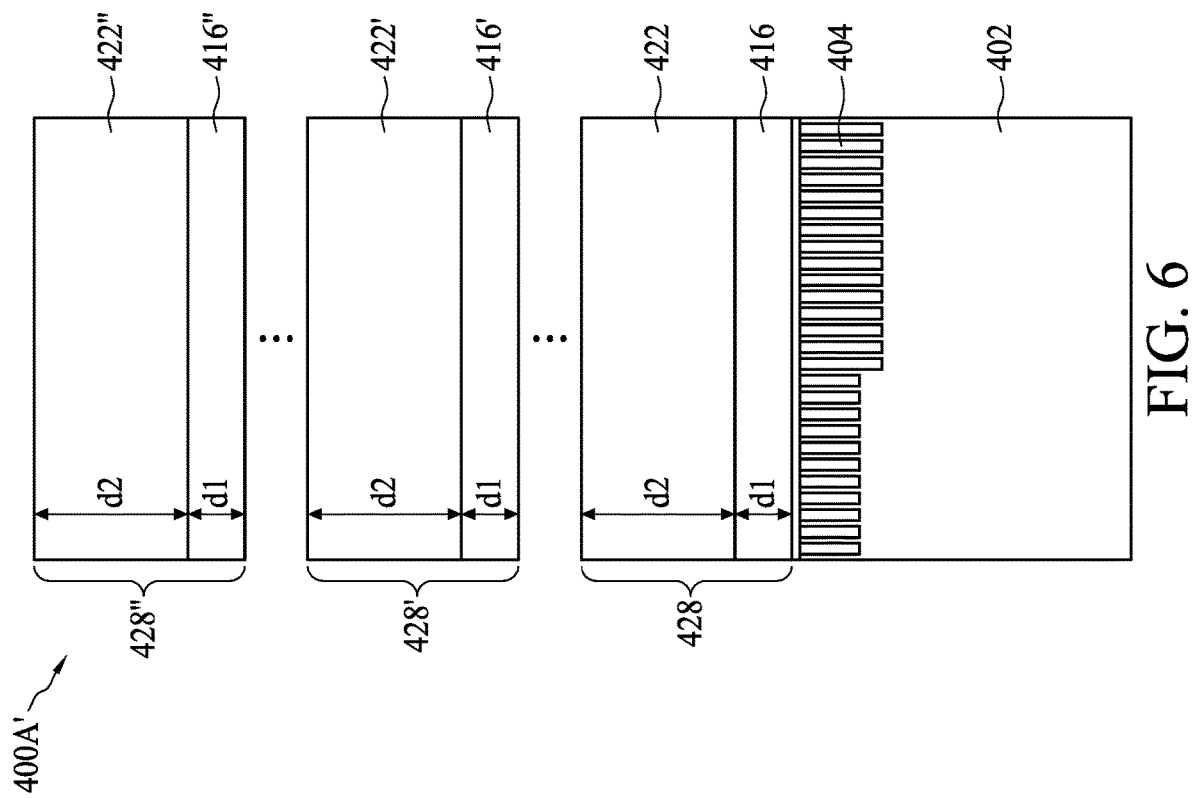
FIG. 6 illustrates a schematic cross-section view of a waveguide region according to some embodiments of the present disclosure.

In some embodiments, referring to FIG. 6, the waveguide region 400A further includes one or more pair of layers over the grating coupler structure 404. For example, a second pair of layers 428' includes a second contact etch stop layer 416' over the first pair of layers 428 and a second ILD material 422' over the second contact etch stop layer 416', where the second pair of layers 428' are same as the first pair of layers 428. For example, a third pair of layers 428" includes a third contact etch stop layer 416" over the second pair of layers 428' and a third ILD material 422" over the third contact etch stop layer 416", where the third pair of layers 428" are same as the first pair of layers 428.

As described above, the grating coupler structure 404 allows the light transmit through the first pair of layers 428, the second pair of layers 428' and the third pair of layers 428" to the optical fiber. Each of the one or more pair of layers includes at least two layers disposed over the grating coupler structure 404. The greater refractive index has the smaller thickness relatively. The variation of the refractive indices by tuning the layers arrangement and the thickness of each layer in the first pair of layers 428 may optimized the coupling efficiency.

FIG. 7 illustrates a schematic cross-section view of a waveguide region 100A according to some embodiments of the present disclosure. The embodiments illustrated in FIG. 7 may also applied to the various aspects of embodiments illustrated in FIGS. 2 to 6. In some embodiments, the semiconductor structure further includes a waveguide 130 over the multi-layers film structure 128, the waveguide 130 may be adjacent to the multi-layers film structure 128. In some embodiments, the waveguide 130 is filled with air. In some embodiments, the waveguide 130 is filled with a waveguide material may include polyimide, epoxy, polymer, dielectric material, and the like, but the disclosure is not limited thereto.

In some embodiments, the present disclosure provides a film scheme over the grating coupler to optimize the coupling efficiency. The variation of the refractive indices by tuning the layers arrangement and the thickness of each layer may optimize the coupling efficiency. At least two layers are disposed over the grating coupler. The thickness of the layer of high refractive index is less than the thickness of the layer of low refractive index In other words, the greater refractive index has the smaller thickness. By this way, the coupling efficiency may be optimized and will not be limited by film scheme over the grating coupler.

As described in greater detail above, some implementations described herein provide a semiconductor structure including a substrate, a grating coupler structure over the substrate and a multi-layers film structure over the grating coupler structure. The multi-layers film structure includes a first layer with a first refractive index, a second layer over the first layer and with a second refractive index and a third layer over the second layer and with a third refractive index. The second refractive index is greater than the first refractive index and is greater than the third refractive index of the third layer. A thickness of each layer of the multi-layers film structure is within a range from $\lambda/4$ to $\lambda/2$, $\lambda$ is a wavelength of light.

As described in greater detail above, some implementations described herein provide a semiconductor structure including a substrate, a grating coupler structure over the substrate and a multi-layers film structure over the grating coupler structure. The multi-layers film structure includes a first layer with a first refractive index; a second layer over the first layer and with a second refractive index and a third layer over the second layer and with a third refractive index. The second refractive index is less than the first refractive index and is less than the third refractive index. A thickness of each layer of the multi-layers film structure is within a range from $\lambda/4$ to $\lambda/2$, $\lambda$ is a wavelength of light.

As described in greater detail above, some implementations described herein provide a semiconductor structure including a substrate, a grating coupler structure over the substrate and a first pair of layers over the grating coupler structure. The first pair of layers includes a first layer including a first refractive index and a first thickness and a second layer over the first layer and including a second refractive index and a second thickness. The first refractive index is greater than the second refractive index, and the first thickness is within a range from $\lambda/4$ to $\lambda/2$, $\lambda$ is a wavelength of light, and the second thickness is within a range from $\lambda/4$ to $\lambda/2$.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a substrate;
   a grating coupler structure over the substrate; and
   a multi-layers film structure over the grating coupler structure, comprising:
   a first layer comprising a first refractive index;
   a second layer over the first layer and comprising a second refractive index; and
   a third layer over the second layer and comprising a third refractive index; and
   wherein the second refractive index is greater than the first refractive index and is greater than the third refractive index of the third layer, and
   wherein a thickness of each layer of the multi-layers film structure is within a range from $\lambda/4$ to $\lambda/2$, $\lambda$ is a wavelength of light.

2. The semiconductor structure of claim 1, wherein a relationship between the thickness of each layer of the multi-layers film structure and a refractive index of each layer of the multi-layers film structure is $n2\pi/\lambda*d=m\pi$, n is the refractive index, d is the thickness, and m is a diffraction order, m being a positive integer.

3. The semiconductor structure of claim 1, wherein a thickness of the first layer is in a range from about 780 nm to about 1310 nm.

4. The semiconductor structure of claim 1, wherein the multi-layers film structure overlaps the grating coupler structure from a top view.

5. The semiconductor structure of claim 1, the multi-layers film structure further comprising a fourth layer comprising a fourth refractive index, wherein the fourth layer is between the first layer and the grating coupler structure.

6. The semiconductor structure of claim 5, wherein the fourth refractive index is greater than the first refractive index.

7. The semiconductor structure of claim 5, wherein the fourth layer covers a top surface of the grating coupler structure.

8. The semiconductor structure of claim 1, further comprising a waveguide over the multi-layers film structure from a top surface of the semiconductor structure to a top surface of the multi-layers film structure, the waveguide being directly adjacent to the multi-layers film structure.

9. The semiconductor structure of claim 8, wherein the waveguide is filled with air.

10. The semiconductor structure of claim 8, wherein the waveguide is filled with a waveguide material.

11. A semiconductor structure, comprising:
    a substrate;
    a grating coupler structure over the substrate; and
    a multi-layers film structure over the grating coupler structure, comprising:
    a first layer comprising a first refractive index;
    a second layer over the first layer and comprising a second refractive index; and
    a third layer over the second layer and comprising a third refractive index; and
    wherein the second refractive index is less than the first refractive index and is less than the third refractive index,
    wherein a thickness of each layer of the multi-layers film structure is within a range from $\lambda/4$ to $\lambda/2$, $\lambda$ is a wavelength of light.

12. The semiconductor structure of claim 11, wherein a relationship between the thickness of each layer of the multi-layers film structure and a refractive index of each layer of the multi-layers film structure is $n2/\lambda*d=m\pi$, wherein n is the refractive index, d is the thickness and m is a diffraction order, m being a positive integer.

13. The semiconductor structure of claim 11, wherein a thickness of the second layer is in a range from about 400 nm to about 2000 nm.

14. The semiconductor structure of claim 11, wherein the multi-layers film structure overlaps the grating coupler structure from a top view.

15. A semiconductor structure, comprising:
 a substrate;
 a grating coupler structure over the substrate; and
 a first pair of layers over the grating coupler structure, comprising:
  a first layer comprising a first refractive index and a first thickness; and
  a second layer over the first layer and comprising a second refractive index and a second thickness,
 wherein the first refractive index is greater than the second refractive index, and wherein the first thickness is within a range from $\lambda/4$ to $\lambda/2$, $\lambda$ is a wavelength of light, and the second thickness is within a range from $\lambda/4$ to $\lambda/2$.

16. The semiconductor structure of claim 15, wherein
 a relationship between the first thickness and the first refractive index is $n1*2\pi/\lambda*d1=m\pi$, wherein n1 is the first refractive index, d1 is the first thickness and m is a diffraction order, m being a positive integer; and
 a relationship between the second thickness and the second refractive index is $n2*2\pi/\lambda*d2=m\pi$, wherein n2 is the second refractive index, d2 is the second thickness.

17. The semiconductor structure of claim 15, wherein the second thickness is in a range from about 400 nm to about 2000 nm.

18. The semiconductor structure of claim 15, wherein the first pair of layers overlaps the grating coupler structure from a top view.

19. The semiconductor structure of claim 15, further comprising:
 a second pair of layers over the first pair of layers, wherein the second pair of layers is same as the first pair of layers.

20. The semiconductor structure of claim 19, further comprising:
 a third pair of layers over the second pair of layers, wherein the third pair of layers is same as the first pair of layers.

\* \* \* \* \*